United States Patent [19]

Takemae

[11] 4,443,868
[45] Apr. 17, 1984

[54] SEMICONDUCTOR MEMORY DEVICE

[75] Inventor: Yoshihiro Takemae, Yokohama, Japan

[73] Assignee: Fujitsu Limited, Kawasaki, Japan

[21] Appl. No.: 318,004

[22] Filed: Nov. 4, 1981

[30] Foreign Application Priority Data

Nov. 4, 1980 [JP] Japan .............................. 55-154811

[51] Int. Cl.$^3$ .............................................. G11C 7/00
[52] U.S. Cl. .................................... 365/205; 365/203
[58] Field of Search ................ 365/203, 205, 207, 208

[56] References Cited

U.S. PATENT DOCUMENTS

| 4,028,557 | 6/1977 | Wilson | 365/205 |
|---|---|---|---|
| 4,122,549 | 4/1978 | Kinoshita | |
| 4,158,241 | 6/1979 | Takemae et al. | 365/205 |

FOREIGN PATENT DOCUMENTS 54-141532  11/1979  Japan .................................. 365/205

OTHER PUBLICATIONS

WO81/03572, Semiconductor Memery Precharge Circuit, Proebsting, published 12/10/81, filed 6/2/80.

Gray, "Bitline Restore Shorting Technique," IBM Tech. Disc. Bul., vol. 20, No. 5, 10/77, pp. 1714–1715.
Patents Abstracts of Japan, vol. 3, No. 30, Mar. 1979, p. 66 E 97; & JP-A-54 8430 (Nippon Denki K.K.)(22-0-1-1979)*Abstract*.
IEEE International Solid-State Circuits Conference, vol. 18, Feb. 13, 1975, p. 1020103, New York; Foss et al.; "Simplified Peripheral Circuits for a Marginally Testable 4K RAM", p. 102, col. 1, last paragraph, FIG. 2a.

Primary Examiner—Stuart N. Hecker
Attorney, Agent, or Firm—Staas & Halsey

[57] ABSTRACT

Disclosed is a dynamic-type semiconductor memory device including a group of sense amplifiers, a plurality of pairs of bit lines extending from the sense amplifiers, and a plurality of dynamic-type memory cells connected to each bit line. Each pair of bit lines are short circuited and then precharged to a high potential level before a read operation. According to the present invention, a control line for activating the sense amplifiers is also used as a control line for short circuiting and precharging each pair of bit lines, resulting in a high degree of integration and a high short-circuiting speed.

8 Claims, 7 Drawing Figures

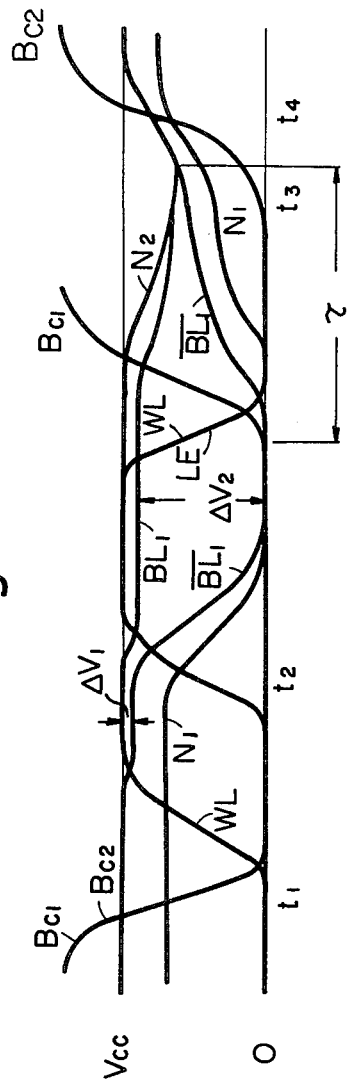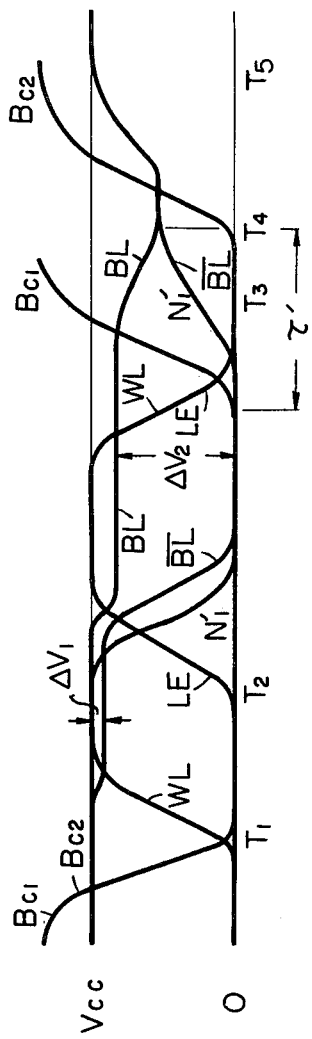

SEMICONDUCTOR MEMORY DEVICE

BACKGROUND OF THE INVENTION

The present invention relates to a semiconductor memory device in which a short between a pair of bit lines, and a charge up of the bit lines, before a read operation, are executed at a high speed, and the number of device wiring lines are decreased.

A dynamic RAM (Random Access Memory) of a one transistor-one capacitor type usually has a structure as illustrated in FIG. 1, comprising a group of sense amplifiers SA arranged in the middle portion of the RAM, column decoders CD and CD'; and cell arrays CA and CA' arranged on both sides of the sense amplifiers. Also included are pairs of bit lines BL and $\overline{BL}$ extending horizontally across the column decoders and CD and CD' and cell arrays, CA and CA' the column decoders CD and CD' selecting one of the pairs of the bit lines, and row decoders RD and RD' for selecting one of the word lines (not shown) extending vertically across the cell arrays CA and CA'. FIG. 2 is a circuit diagram illustrating a main portion of the sense amplifiers SA and their peripheral circuits in detail in the RAM of FIG. 1 (see, for example, IBM Technical Disclosure Bulletin vol. 20 No. 5 October 1977, pp1714–1715), wherein, $Q_{11}$, $Q_{12}$, ... $Q_{41}$, $Q_{42}$, ... represent transistors for shorting and precharging the pairs of the bit lines ($BL_1$, $\overline{BL}_1$), ($BL_2$, $\overline{BL}_2$), .... Each sense amplifier SA is in the form of a flip flop consisting of two transistors $Q_{21}$ and $Q_{31}$, $Q_{22}$ and $Q_{32}$, .... All of the sense amplifiers are commonly connected to a first control line $N_1$ for driving the sense amplifiers. The source (or drain), the gate and the drain (or source) of the transistor $Q_{11}$ are connected to a second control line $N_2$, a third control line $N_3$ and the bit line $\overline{BL}_1$, respectively. The other precharging and shorting transistors are also connected to the second control line $N_2$, the third control line $N_3$, and the respective bit lines similar to the connections of transistor $Q_{11}$. Memory cells $MC_{11}$, $MC_{12}$, ..., $MC_{21}$, $MC_{22}$, ... are connected between the bit lines and a word line, respectively. Each memory cell consists of one transistor and one capacitor. For example, the memory cell $MC_{11}$ consists of a transistor $Q_{51}$ having a drain connected to the bit line $\overline{BL}_1$, a gate connected to the word line $WL_1$ and a source connected to one electrode of a capacitor $C_{11}$ whose other electrode is connected to a power supply $V_{cc}$.

In the operation of the RAM illustrated in FIGS. 1 and 2, the pairs of the bit lines BL and $\overline{BL}$ are charged up to a high potential level (generally to a power supply potential $V_{cc}$) before reading the information stored in a cell. Before the precharging, a short circuit is effected between each pair of the bit lines to equalize the potential of the bit lines. That is, the transistors $Q_{11}$, $Q_{12}$, ..., $Q_{41}$, $Q_{42}$, ... are rendered conductive by setting the electric potential on the third control line $N_3$ to a high potential level which is higher than the power supply potential $V_{cc}$. The potential of the third control line $N_3$ is raised by applying the high potential of a clock signal $B_{cl}$ to the control line $N_3$ as illustrated in FIG. 4. A transistor $Q_2$ is inserted between the power supply $V_{cc}$ and the second control line $N_2$. A clock signal $B_{c2}$ is applied to the gate of the transistor $Q_2$. While the clock signal $B_{c2}$ is at a low level, and therefore the transistor $Q_2$ is cutoff, a current flows in the direction of the arrows illustrated in FIG. 2, from the bit lines at a high potential (in FIG. 2, from the side of the bit lines $BL_1$, $BL_2$, ... ) to the bit lines at a low potential (in FIG. 2, to the side of the bit lines $\overline{BL}_1$, $\overline{BL}_2$, ... ), so that the potentials of both bit lines are balanced at a time near the point $t_3$ (see FIG. 4). When the potential of the clock signal $B_{c2}$ is raised to a level higher than the power supply potential $V_{cc}$ at a time near the point $t_4$, the transistor $Q_2$ is turned on so that the pairs of the bit lines ($BL_1$, $\overline{BL}_1$), ($BL_2$, $\overline{BL}_2$) ... are precharged to the power supply potential $V_{cc}$.

In the reading operation, the clock signals $B_{c1}$ and $B_{c2}$ are turned to the low level so that the control line $N_2$ and the bit lines BL and $\overline{BL}$ are brought into a floating state. Then, one of the word lines $WL_2$ is selected by the row decoder, so that the selected work line is raised to the high potential level $V_{cc}$ at a time $t_1$. At the same time, the corresponding dummy word line DWL (not shown) is also selected to be the high potential level $V_{cc}$. Thus, the selected memory cell and its corresponding dummy cell are connected to the respective bit lines BL and $\overline{BL}$. For example, when the memory cell $MC_{21}$ and its dummy cell $DC_{11}$ (not shown) are selected and the memory cell $MC_{21}$ stores the information "1", charges on the bit line $\overline{BL}_1$ flow into the capacitor of the dummy cell $DC_{11}$ but charges on the bit line $BL_1$ do not flow into the capacitor $C_{21}$. Therefore, a small potential difference is produced between the pair of bit lines $BL_1$ and $\overline{BL}_1$. When such a small potential difference $\Delta V_1$ is produced between the bit lines $BL_1$ and $\overline{BL}_1$ at a time $t_2$, a clock signal LE is raised to the high potential level $V_{cc}$. The clock signal LE is applied to the gate of the transistor $Q_1$ which is inserted between the first control line $N_1$ and the ground. Thus, the potential of the control line $N_1$ is decreased to zero volts so that the sense amplifiers SA are activated. Due to the potential difference $\Delta V_1$ between the bit lines $BL_1$ and $\overline{BL}_1$, one of the transistors in the sense amplifier, for example, the transistor $Q_{21}$ is turned on and the other transistor in the sense amplifier, for example, the transistor $Q_{31}$ is turned off. As a result, a large potential difference $\Delta V_2$ is obtained between the bit lines $BL_1$ and $\overline{BL}_1$. This potential difference is transferred through data lines (not shown in FIG. 2) to a read/write amplifier (not shown in FIG. 2) and amplified therein.

However, there are disadvantages in the circuit configuration of the conventional RAM illustrated in FIGS. 1 and 2. This is, the second control line $N_2$ for precharging and shorting the bit lines which is provided is too long because the bit lines BL and $\overline{BL}$ are separated by the sense amplifiers, and therefore, the control line $N_2$ must be wired taking a long way around the sense amplifiers. Therefore, the resistance of the control line $N_2$ is too large to short the bit lines rapidly even when the control line $N_2$ is wired with aluminum. Because of the large resitance of the control line $N_2$, the bit line BL falls very slowly and the bit line $\overline{BL}$ rises very slowly as illustrated in FIG. 4. It takes a time period $\tau$ from the beginning of the rising of the clock signal $B_{c1}$ to the time when the potentials of the bit lines BL and $\overline{BL}$ are equalized. Further, in view of the high circuit integration being practiced on memory devices, the presence of the second control line $N_2$ is not preferred.

SUMMARY OF THE INVENTION

An object of the present invention is to provide a semiconductor memory device having a high degree of integration.

Another object of the invention is to provide a semiconductor memory device which operates at a high speed.

Still another object of the invention is to provide a semiconductor memory device in which a control line for activating sense amplifiers is commonly used as another control line for shorting and precharging pairs of bit lines when the sense amplifiers are in a standby state, so that a separate control line for shorting and precharging the pairs of bit lines can be eliminated.

In order to achieve the above objects, according to the present invention, there is provided a semiconductor memory device including: a plurality of pairs of bit lines, each pair of the bit lines being short circuited and precharged to a high potential level before a read operation, a plurality of word lines intersecting the bit lines, and a plurality of dynamic-type memory cells, each of the memory cells being connected between one of the bit lines and one of the word lines. Also included are a plurality of sense amplifiers, each of the sense amplifiers having a terminal to activate the sense amplifier and each for detecting the potential difference between a pair of bit lines, and a control line which is connected to the terminal for activating the sense amplifiers and is commonly used as a control line for short circuiting and precharging each of the pairs of bit lines.

These objects and advantages as well as the characteristic features of the present invention will be more readily understood from the following description of the preferred embodiments with reference to the accompanying drawings in which the same reference characters designate the same or similar portions of the device.

BRIEF DESCRIPTION OF THE DRAWINGS

FIG. 4 is a graph illustrating waveforms used for explaining the operation of the circuit of FIG. 2;

FIG. 5 is a graph illustrating waveforms used for explaining the operation of the circuit of FIG. 3;

DESCRIPTION OF THE PREFERRED EMBODIMENTS

Figure 1:
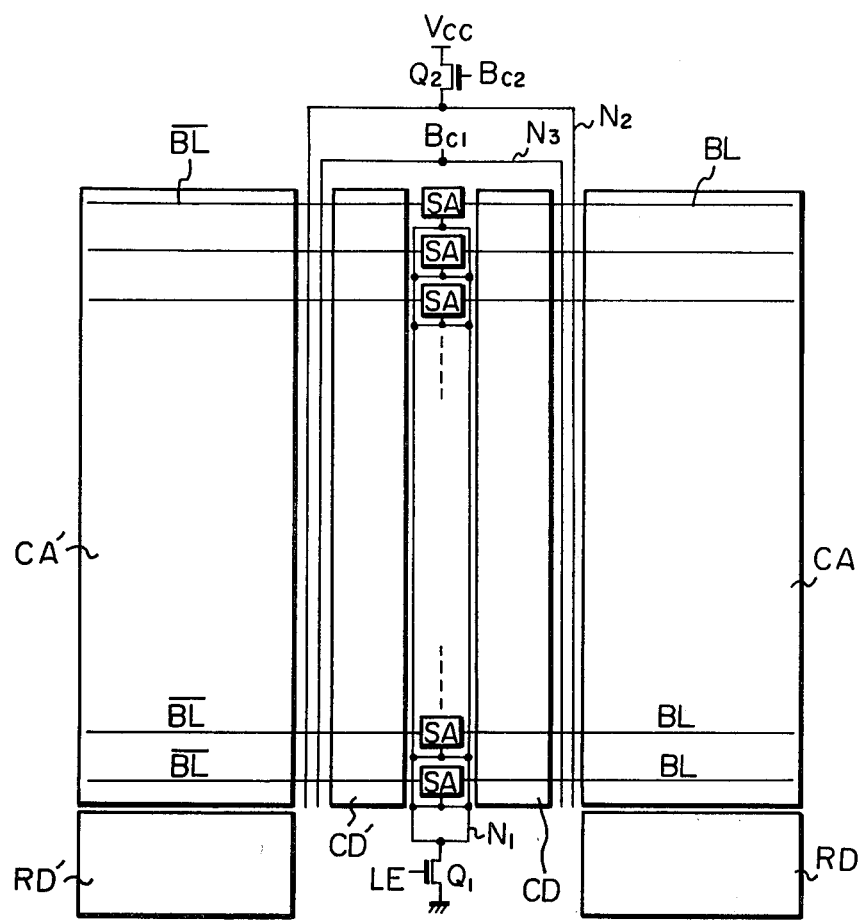
FIG. 1 is a block diagram illustrating an example of a conventional dynamic RAM.
Figure 2:
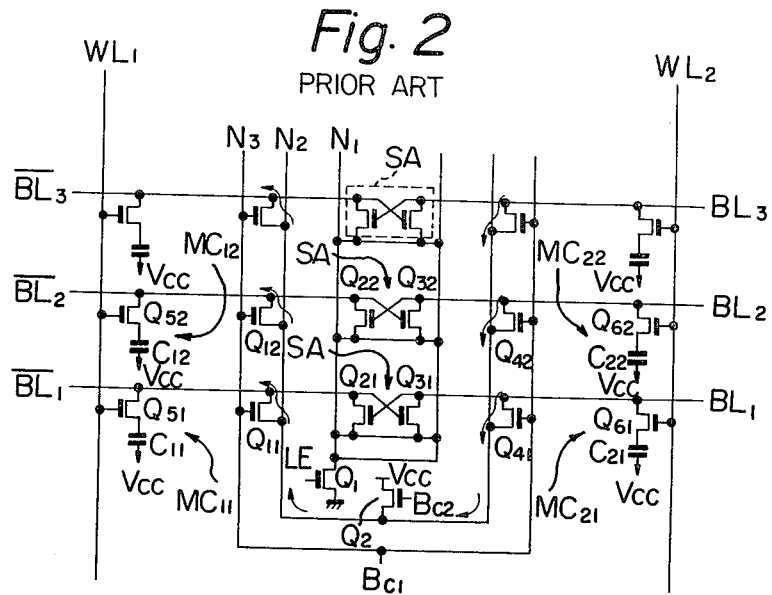
FIG. 2 is a circuit diagram illustrating a main portion of the sense amplfiers and their peripheral circuits in the RAM of FIG. 1.
Figure 3:
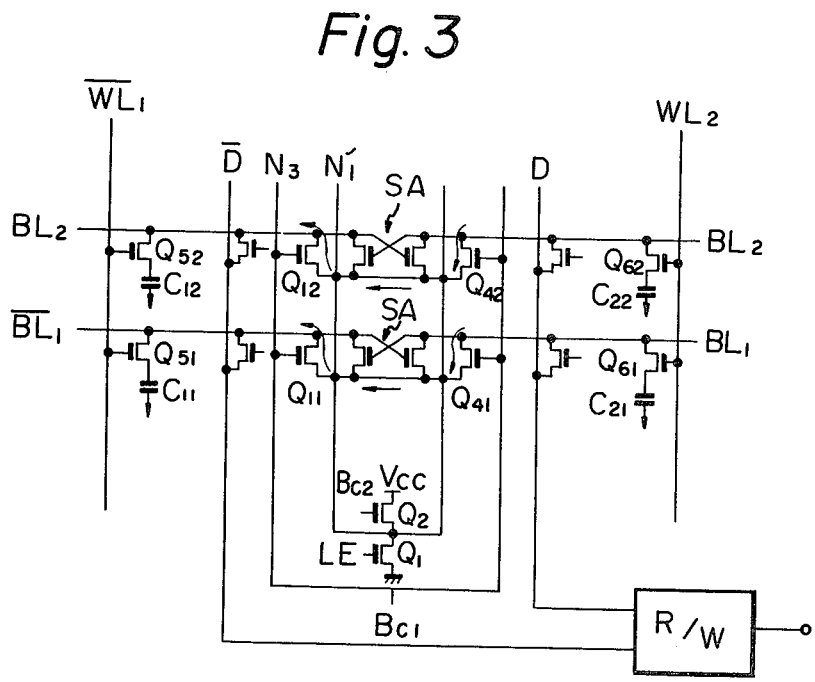
FIG. 3 is a circuit diagram illustrating a main portion of the sense amplifiers and their peripheral circuits, according to one embodiment of the present invention.

FIG. 3 is a circuit diagram illustrating the main portion of sense amplifiers SA and their peripheral circuits, according to one embodiment of the present invention. The main difference between the circuit of FIG. 2 and the circuit of FIG. 3 is that, instead of the first control line $N_1$ and the second control line $N_2$ in the circuit of FIG. 2, only one control line $N_1'$ is provided in the circuit of FIG. 3. That is, the second control line $N_2$ in FIG. 2 is eliminated in FIG. 3. Referring to FIG. 3, the sources or the drains of the transistors $Q_{11}$, $Q_{12}$, ..., $Q_{41}$, $Q_{42}$, ... for shorting and charging up the pairs of the bit lines, which were connected to the second control line $N_2$ in the conventional circuit of FIG. 2, are connected to the control line $N_1'$ for driving the sense amplifiers SA. The source of the transistor $Q_2$ is connected, instead of being connected to the second control line $N_2$ in FIG. 2, to the control line $N_1'$. The other connections in the circuit of FIG. 3 are the same as the connections in the circuit of FIG. 2. Although only one memory cell connected to each bit line is illustrated for the purpose of simplicity in FIGS. 2 and 3, a number of memory cells and a dummy memory cell are connected to each bit line in actual practice.

The operation of the circuit of FIG. 3 will now be explained with reference to FIG. 5, wherein the waveform of the clock signal $B_{c1}$ for driving the control line $N_3$, the waveform of the clock signal LE for driving the transistor $Q_1$, the waveform of the clock signal $B_{c2}$ for driving the transistor $Q_2$, and the waveform of the word line WL are the same as those in the circuit of FIG. 2. However, the waveform of the control line $N_1'$ and accordingly the waveforms of the bit lines BL and $\overline{BL}$ in FIG. 5 are different from those of the first control line $N_1$ and the bit lines BL and $\overline{BL}$ in FIG. 4. That is, when the small potential difference $\Delta V_1$ is produced between the bit lines BL and $\overline{BL}$ after the word line WL is selected at a time $T_1$ and is to be raised to the high potential level $V_{cc}$, the clock signal LE is raised to the $V_{cc}$ level at a time $T_2$, so that the transistor $Q_1$ is turned on, resulting in the control line $N_1'$ voltage level becoming zero volts. Then, the sense amplifiers SA are activated so that the potential difference between the bit lines BL and $\overline{BL}$ is expanded. A thus obtained large potential difference $\Delta V_2$ is transferred through data lines D and $\overline{D}$ to a read/write amplifier R/W and amplified therein. When the reading operation is completed, the potentials of the word line WL and the clock signal LE are lowered to zero volts. For the next reading operation, the potential of the clock signal $B_{c1}$ is raised to a level higher than $V_{cc}$ near the time $T_3$. Then, the transistors $Q_{11}$, $Q_{12}$, ..., $Q_{41}$, $Q_{42}$, ... are turned on so that each pair of the bit lines BL and $\overline{BL}$ are shorted to the same electric potential at a time $T_4$. During this shorted period, a current flows from the bit line at the high potential through each sense amplifier SA to the bit line at the low potential. For example, when the bit line BL is at the high potential and the bit line $\overline{BL}$ is at the low potential, a current flows, in the direction of the arrows illustrated in FIG. 3, from the bit BL through each sense amplifier SA to the bit line $\overline{BL}$, so that the electric potentials at the bit lines BL and $\overline{BL}$ and at the control line $N_1'$ are equalized. Therefore, the current for shorting the bit lines $BL_1$ and $\overline{BL}_1$ flows from the bit line $BL_1$ past the transistor $Q_{41}$, through the commonly connected drains of the pair of transistors in the sense amplifier SA, and through the transistor $Q_{11}$ to the bit line $\overline{BL}_1$. The other currents for shorting the bit lines BL and $\overline{BL}$ are also conducted through respective sense amplifiers SA. Thus, the short-circuit current does not flow through the control line $N_1'$. As a result, a rapid shorting and equalizing of the potentials between the bit lines BL and $\overline{BL}$ can be effected according to this embodiment, because the resistance of the control line $N_1'$ does not affect the flow of the short-circuit current. As illustrated in FIG. 5, it takes a time period $\tau'$ from the beginning of the rise of the clock signal $B_{c1}$ before the time $T_3$ to the time when the potentials of the bit lines BL and $\overline{BL}$ are equalized at the time $T_4$. The time period $\tau'$ is much smaller than the time period $\tau$ in FIG. 4. After this, at the time $T_5$, the clock signal $B_{c2}$ is raised to a high potential level higher than the power supply potential $V_{cc}$, so that the transistor $Q_2$ is turned on for precharging the bit lines BL and $\overline{BL}$ to the power supply potential $V_{cc}$. From the time $T_4$, when the short circuit is completed, to the time $T_5$, when the clock signal $B_{c2}$ is raised to the high potential level, the potential at the control line $N_1'$ rises from a level nearly equal to $V_{cc}/2$ to the power supply potential $V_{cc}$. However, the sense amplifiers SA are not activated when the potential at the control line $N_1'$ is at such a high level. The sense amplifiers SA are activated only when the control line $N_1'$ is lowered to zero volts after the potentials of the clock signals $B_{c1}$ and $B_{c2}$ are lowered to zero volts near the time $T_1$ and then the clock signal LE is raised to the $V_{cc}$ level to turn on the transistor $Q_1$ near the time $T_2$.

Figure 6:
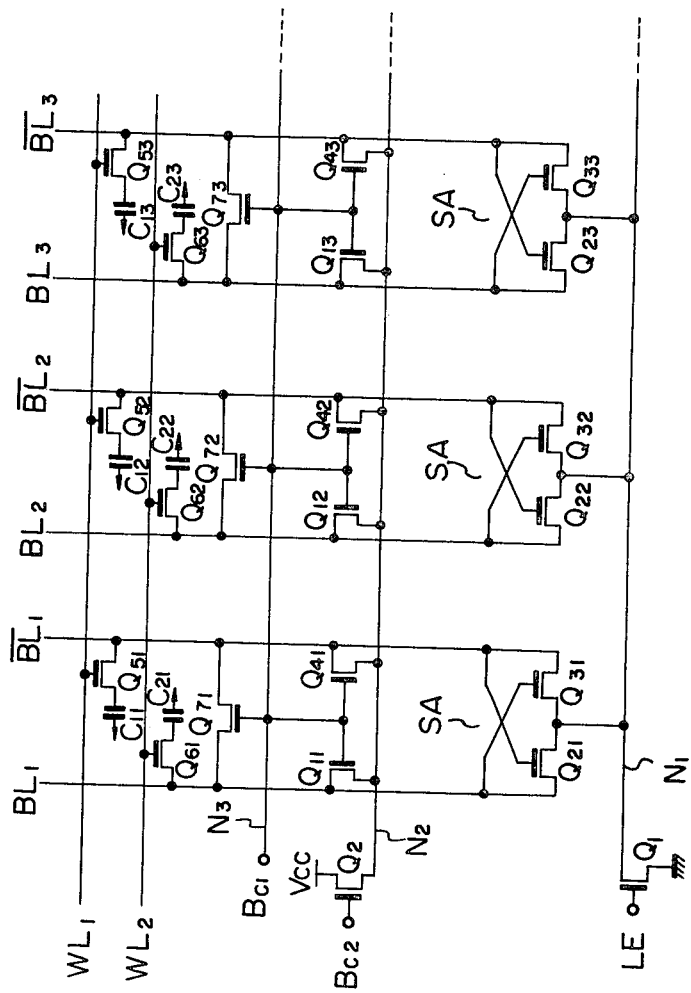
FIG. 6 is a circuit diagram illustrating another example of a conventional dynamic RAM.

FIG. 6 is a circuit diagram illustrating another example of a conventional dynamic RAM. In FIG. 6, each pair of bit lines BL and $\overline{BL}$ are arranged in parallel, forming a so-called folded bit line structure. The transistors $Q_1$, $Q_2$, $Q_{11}$, $Q_{21}$, $Q_{31}$, $Q_{41}$, $Q_{51}$, $Q_{61}$, ... and the capacitors $C_{11}$, $C_{12}$, ... are connected in the same way as in the conventional circuit of FIG. 2. Also, the operations of the clock signals LE, $B_{c1}$ and $B_{c2}$ are substantially the same as those in the circuit of FIG. 2. The only difference between the circuits of FIG. 2 and FIG. 6 is that, in FIG. 6, transistors $Q_{71}$, $Q_{72}$, $Q_{73}$, ... are provided between each pair of bit lines BL and $\overline{BL}$. The gate of each transistor $Q_{71}$, $Q_{72}$, $Q_{73}$, ... is connected to the third control line $N_3$. Because of the folded-bit line structure, the third control line $N_3$ does not take a long way around the sense amplifiers SA as in the circuit of FIG. 2. Therefore, the short circuit between each pair of bit lines BL and $\overline{BL}$ in the circuit of FIG. 6 is effected rapidly in comparison with the circuit of FIG. 2. However, the presence of the third control line $N_3$ still causes a problem in a high degree of integration.

Figure 7:
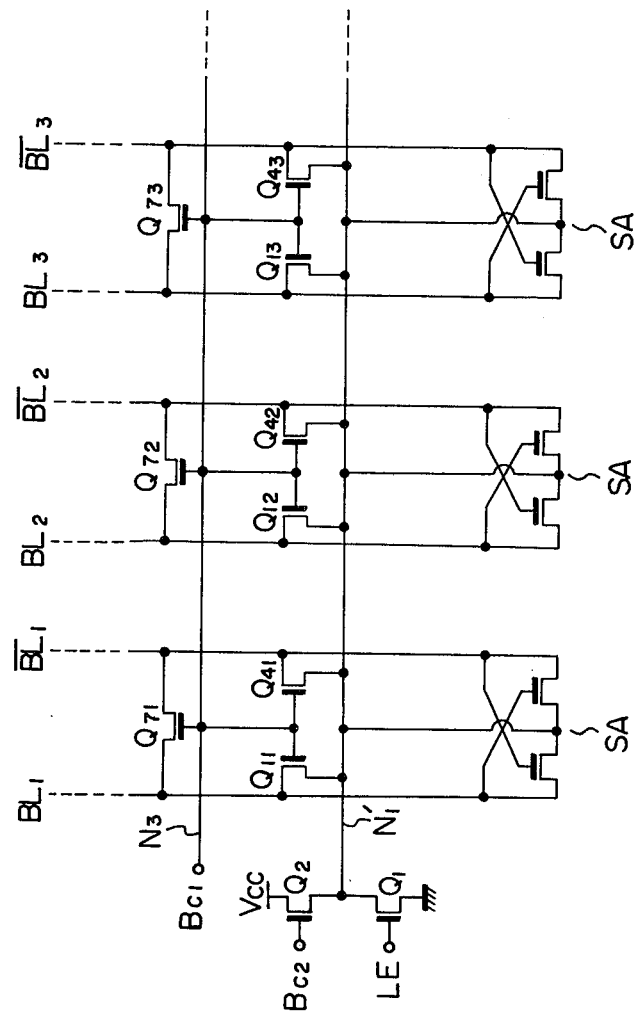
FIG. 7 is a circuit diagram illustrating a dynamic RAM, according to another embodiment of the present invention.

FIG. 7 is a circuit diagram illustrating a dynamic RAM in which the second control line $N_2$ is eliminated, according to another embodiment of the present invention. In FIG. 7, instead of two control lines $N_1$ and $N_2$ in FIG. 6, a single control line $N_1'$ is provided. The connecting pattern between the control line $N_1'$ and the elements in the circuit of FIG. 7 is the same as in the circuit of FIG. 3 and therefore, is not explained here. Although, memory cells and a dummy memory cell connected to each bit line are not illustrated in FIG. 7 for the purpose of simplicity, a number of memory cells and a dummy memory cell are connected to each bit line in actual practice.

According to this second embodiment, the advantage of a high degree of integration is also obtained. But the effect of high speed shorting operation is not the specific advantage of this embodiment.

From the foregoing description, it will be apparent that, according to the present invention, in a dynamic-type semiconductor memory device, the number of wiring lines in the periphery of the sense amplifiers can be decreased, so that the degree of integration can be improved and the time required for shorting each pair of bit lines can be shortened.

It will be apparent to those skilled in the art that the present invention is not restricted to the foregoing embodiments but various changes and modifications are possible without departing from the scope of the claimed invention. For example, the present invention may be applied to any dynamic-type semiconductor memory device having any memory capacity.

I claim:

1. A semiconductor memory device, comprising:
    a plurality of pairs of bit lines, each pair of said bit lines being short circuited and precharged to a potential level before a read operation;
    a plurality of word lines intersecting said bit lines;
    a plurality of dynamic-type memory cells, each of said dynamic-type memory cells being operatively connected to one of said pairs of bit lines and one of said word lines;
    a plurality of sense amplifiers, each of said sense amplifiers operatively connected to a pair of bit lines, each of said sense amplifiers having a terminal to activate the sense amplifier, and each for detecting the potential difference between each pair of said bit lines; and
    a control line, operatively connected to said terminals and said bit lines and crossing both of the bit lines in each of said pairs of bit lines, for activating said sense amplifiers and being commonly used as a control line for short circuiting and precharging each of said pairs of bit lines.

2. A semiconductor memory device as set forth in claim 1, wherein each of said sense amplifiers comprises a flip-flop including two transistors each having a source, the sources of said two transistors being operatively connected to said terminal.

3. A semiconductor memory device as set forth in claim 1, wherein a short circuiting transistor is operatively connected between said control line and each of said bit lines.

4. A semiconductor memory device as set forth in claim 1, wherein a precharging transistor is operatively connected between a power supply and said control line.

5. A semiconductor memory device as set forth in claim 1, wherein an activating transistor for activating said sense amplifiers is operatively connected between said control line and ground.

6. A semiconductor memory device as set forth in claim 1, wherein a short circuiting transistor is operatively connected between each of said pairs of the bit lines.

7. A semiconductor memory device as set forth in claim 1, 2, 3, 4, 5 or 6, wherein each said dynamic-type memory cell comprises:
    a cell transistor having a drain, a gate operatively connected to one of said word lines and a source operatively connected to one of said bit lines; and
    a capacitor operatively connected to said drain of said cell transistor.

8. A semiconductor memory device as set forth in claim 1, 2, 3, 4, 5 or 6, wherein each said dynamic-type memory cell comprises:
    a cell transistor having a source, a gate operatively connected to one of said word lines and a drain operatively connected to one of said bit lines; and
    a capacitor operatively connected to said source of said cell transistor.

* * * * *

UNITED STATES PATENT AND TRADEMARK OFFICE
CERTIFICATE OF CORRECTION

PATENT NO. : 4,443,868
DATED : April 17, 1984
INVENTOR(S) : Yoshihiro Takemae

It is certified that error appears in the above-identified patent and that said Letters Patent is hereby corrected as shown below:

On the title page

[56] References Cited, "365/222" should be inserted after "Kinoshita";
[56] Other Publications, "Memery" should be --Memory--.

Column 1, line 14, ";" should be --,--;
line 17, delete "and";
line 18, delete ",";
after "CA'", insert --,--;
line 27, "..." should be --...,--.

Column 2, line 47, "This" should be --That--.

Column 3, line 13, delete ":".

Column 4, line 46, "after "bit", insert --line--;
line 51, "past" should be --through--;
"through" should be past--.

Signed and Sealed this

Twelfth Day of March 1985

[SEAL]

Attest:

DONALD J. QUIGG

Attesting Officer    Acting Commissioner of Patents and Trademarks